United States Patent
Tsai et al.

(10) Patent No.: US 8,520,439 B2
(45) Date of Patent: Aug. 27, 2013

(54) MEMORY ARRAY AND METHOD FOR PROGRAMMING MEMORY ARRAY

(75) Inventors: Wen-Jer Tsai, Hsinchu (TW); Ping-Hung Tsai, Hsinchu (TW); Jyun-Siang Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 58 days.

(21) Appl. No.: 13/346,432

(22) Filed: Jan. 9, 2012

(65) Prior Publication Data

US 2013/0176789 A1 Jul. 11, 2013

(51) Int. Cl.
*G11C 16/12* (2006.01)

(52) U.S. Cl.
USPC ............ 365/185.19; 365/185.17; 365/185.18; 365/185.28

(58) Field of Classification Search
None
See application file for complete search history.

(56) References Cited

U.S. PATENT DOCUMENTS

| | | | | |
|---|---|---|---|---|
| 7,463,533 B2* | 12/2008 | Kurata et al. | ............ | 365/185.29 |
| 7,848,150 B2* | 12/2010 | Lee et al. | ................. | 365/185.22 |
| 7,974,130 B2* | 7/2011 | Nakamura et al. | ......... | 365/185.2 |
| 2011/0305088 A1* | 12/2011 | Huang et al. | ............. | 365/185.15 |
| 2012/0081962 A1* | 4/2012 | Tsai et al. | ................ | 365/185.15 |
| 2013/0088920 A1* | 4/2013 | Huang et al. | ............. | 365/185.17 |

\* cited by examiner

*Primary Examiner* — Tan T. Nguyen
(74) *Attorney, Agent, or Firm* — J.C. Patents

(57) ABSTRACT

A method for programming a memory array is provided. The memory array includes a memory cell string composed of a first transistor, a plurality of memory cells and a second transistor connected in series, and the method for programming the memory array includes following steps. In a setup phase, a switching memory cell in the memory cells is turned off, and a first voltage and a second voltage are applied to a first source/drain and a second source/drain of the switching memory cell. In a programming phase, a bit line connected to the memory cell string is floating, and a ramp signal is provided to a word line electrically connected to the switching memory cell.

20 Claims, 8 Drawing Sheets

MEMORY ARRAY AND METHOD FOR PROGRAMMING MEMORY ARRAY

BACKGROUND OF THE INVENTION

1. Field of the Invention

The invention relates to a memory array and a method for operating a memory array. Particularly, the invention relates to a memory array with a memory cell string and a programming method thereof.

2. Description of Related Art

Semiconductor memories can be grouped into volatile memories and non-volatile memories, where the non-volatile memories can preserve data without power, which are widely used in long-term data storage. Moreover, types of the non-volatile memories are diversified, in which flash memories become a main stream in the market, and the flash memory can be applied in computers, peripheral products, portable systems, mobile communication and consumer electronics, etc.

Generally, the conventional flash memory is programmed with data based on a Fowler-Nordheim (FN) tunneling effect. However, the programming operation performed based on the FN tunneling effect requires a higher operation voltage and a higher gate-coupling ratio (GCR).

SUMMARY OF THE INVENTION

Accordingly, an embodiment of the invention provides a method for programming a memory array, by which a bit line is floating during a programming phase, so as to reduce a current flowing through a memory cell string, and accordingly reduce power consumption of the memory array.

Another embodiment of the invention provides a method for programming a memory array, by which based on an equivalent capacitance contributed by a bit line in a floating state, memory cells on different word lines all have a same programming speed, which avails increasing reliability and a whole performance of the memory array.

Another embodiment of the invention provides a memory array capable of reducing a current flowing through a memory cell string, and accordingly reducing power consumption of the memory array.

Another embodiment of the invention provides a memory array capable of increasing reliability and a whole performance of the memory array.

An embodiment of the invention provides a method for programming a memory array. The memory array includes a memory cell string composed of a first transistor, a plurality of memory cells and a second transistor connected in series, and the method for programming the memory array includes following steps. In a setup phase, a switching memory cell in the memory cells is turned off, and a first voltage and a second voltage are applied to a first source/drain and a second source/drain of the switching memory cell. In a programming phase, a bit line connected to the memory cell string is floating, and a ramp signal is provided to a word line electrically connected to the switching memory cell.

According to an embodiment of the invention, the memory array further includes a third transistor, where a source of the third transistor is electrically connected to the bit line, and the step of applying the first voltage and the second voltage to the first source/drain and the second source/drain of the switching memory cell includes following steps. The other memory cells in the memory cells except the switching memory cell are turned on. The first transistor, the second transistor and the third transistor are turned on. The first voltage is applied to a drain of the third transistor, and the second voltage is applied to a common source line electrically connected to the second transistor.

According to an embodiment of the invention, the method for programming the memory array further includes turning off the third transistor in the programming phase to float the bit line connected to the memory cell string.

According to an embodiment of the invention, the step of providing the ramp signal to the word line electrically connected to the switching memory cell includes following steps. During a first sub period of the programming phase, a first sub ramp signal with a gradually increased voltage level is provided to the word line. During a second sub period of the programming phase, a second sub ramp signal with a gradually decreased voltage level is provided to the word line, where the ramp signal is composed of the first sub ramp signal and the second sub ramp signal.

According to an embodiment of the invention, when a difference between the first voltage and the second voltage is greater than a predetermined voltage, a selected memory cell adjacent to the switching memory cell in the memory cells is programmed in the programming phase, and when the difference between the first voltage and the second voltage is not greater than the predetermined voltage, the programming of the selected memory cell is inhibited in the programming phase.

Another embodiment of the invention provides a method for programming a memory array. The memory array includes a memory cell string composed of a first transistor, a plurality of memory cells and a second transistor connected in series, and the method for programming the memory array includes following steps. In a setup phase, a switching memory cell in the memory cells is turned off, and a first voltage is applied to a first source/drain of the switching memory cell, and the second transistor is turned off. In a programming phase, a bit line connected to the memory cell string is floating, a second voltage is applied to a second source/drain of the switching memory cell, and a ramp signal is provided to a word line electrically connected to the switching memory cell.

Another embodiment of the invention provides a memory array. The memory array includes a memory cell string, a third transistor and a capacitor. The memory cell string is electrically connected in series between a bit line and a common source line, and includes a first transistor, a plurality of memory cells and a second transistor. A source of the third transistor is electrically connected to the bit line, and a drain of the third transistor receives a first voltage. In a setup phase, the memory array turns off a switching memory cell in the memory cells, and turns on the first transistor, the second transistor and the third transistor so as to apply the first voltage and a second voltage to a first source/drain and a second source/drain of the switching memory cell. In a programming phase, the memory array turns off the third transistor to float the bit line, and provides a ramp signal to a word line electrically connected to the switching memory cell.

Another embodiment of the invention provides a memory array. The memory array includes a memory cell string, a third transistor and a capacitor. The memory cell string is electrically connected in series between a bit line and a common source line, and includes a first transistor, a plurality of memory cells and a second transistor. A source of the third transistor is electrically connected to the bit line, and a drain of the third transistor receives a first voltage. In a setup phase, the memory array turns off a switching memory cell in the memory cells, turns on the first transistor and the third transistor so as to apply the first voltage to a first source/drain of the switching memory cell, and turns off the second transistor. In a programming phase, the memory array turns off the third transistor to float the bit line, turns on the second transistor so as to apply the a second voltage to a second source/drain of the switching memory cell, and provides a ramp signal to a word line electrically connected to the switching memory cell.

According to the above descriptions, the first voltage and the second voltage are first applied to the first source/drain and the second source/drain of the switching memory cell, and the selected memory cell is programmed based on a floating state of the bit line and the ramp signal supplied to the switching memory cell. In this way, since the bit line is in the floating state in the programming phase, the current flowing through the memory cell string is reduced. Moreover, based on the equivalent capacitance contributed by the bit line in the floating state, the selected memory cells on different word lines all have the same programming speed.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Before a method for programming a memory array is described, a structure of the memory array is first introduced below.

Figure 1:
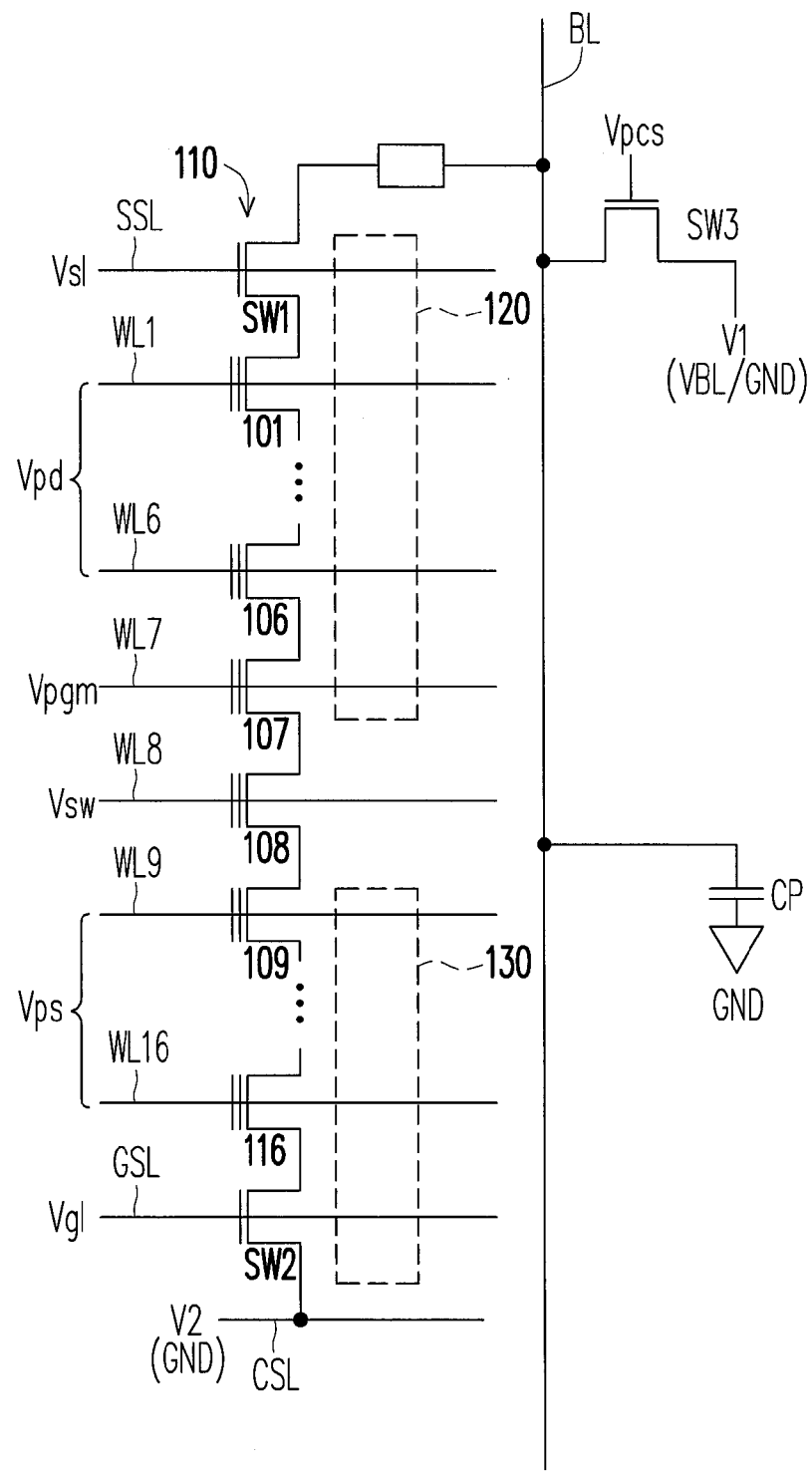
FIG. 1 is a schematic diagram of a memory array according to an embodiment of the invention.

FIG. 1 is a schematic diagram of a memory array according to an embodiment of the invention. Referring to FIG. 1, the memory array 100 includes a plurality of memory cell strings, and for simplicity's sake, only a memory cell string 110 is illustrated in FIG. 1. The memory cell string 110 includes a first transistor SW1, a plurality of memory cells 101-116 and a second transistor SW2. The first transistor SW1, the memory cells 101-116 and the second transistor SW2 are connected in series between a bit line BL and a common source line CSL. Moreover, gates of the first transistor SW1 and the second transistor SW2 are electrically connected to a string selection line SSL and a ground selection line GSL, respectively, and the memory cells 101-116 are electrically connected to word lines WL1-WL16.

The memory array 100 further includes a third transistor SW3 and a capacitor CP. A source of the third transistor SW3 is electrically connected to the bit line BL, and a drain of the third transistor SW3 receives a first voltage V1. In this way, whether the bit line BL receives the first voltage V1 is determined by whether the third transistor SW3 is turned on. On the other hand, the capacitor CP is electrically connected to the bit line BL, and a capacitance of the capacitor CP is far greater than a channel capacitance CH contributed by the memory cell string 110, for example, CP=100*CH. In an actual application, the capacitor CP is, for example, an equivalent capacitor of the bit line BL. Alternatively, the capacitor CP can be composed of an additional capacitor and the equivalent capacitor of the bit line BL.

Figure 2:
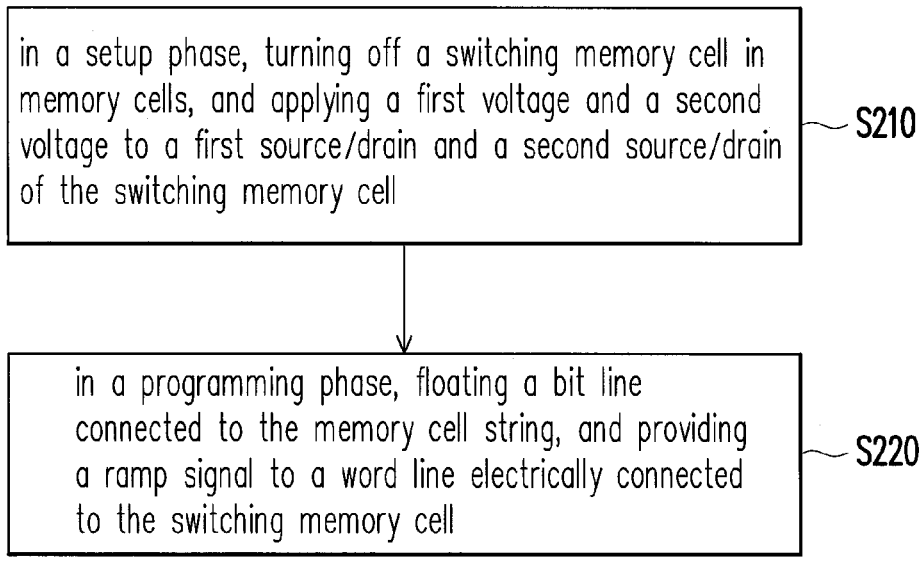
FIG. 2 is a flowchart illustrating a method for programming a memory array according to an embodiment of the invention.
Figure 3:
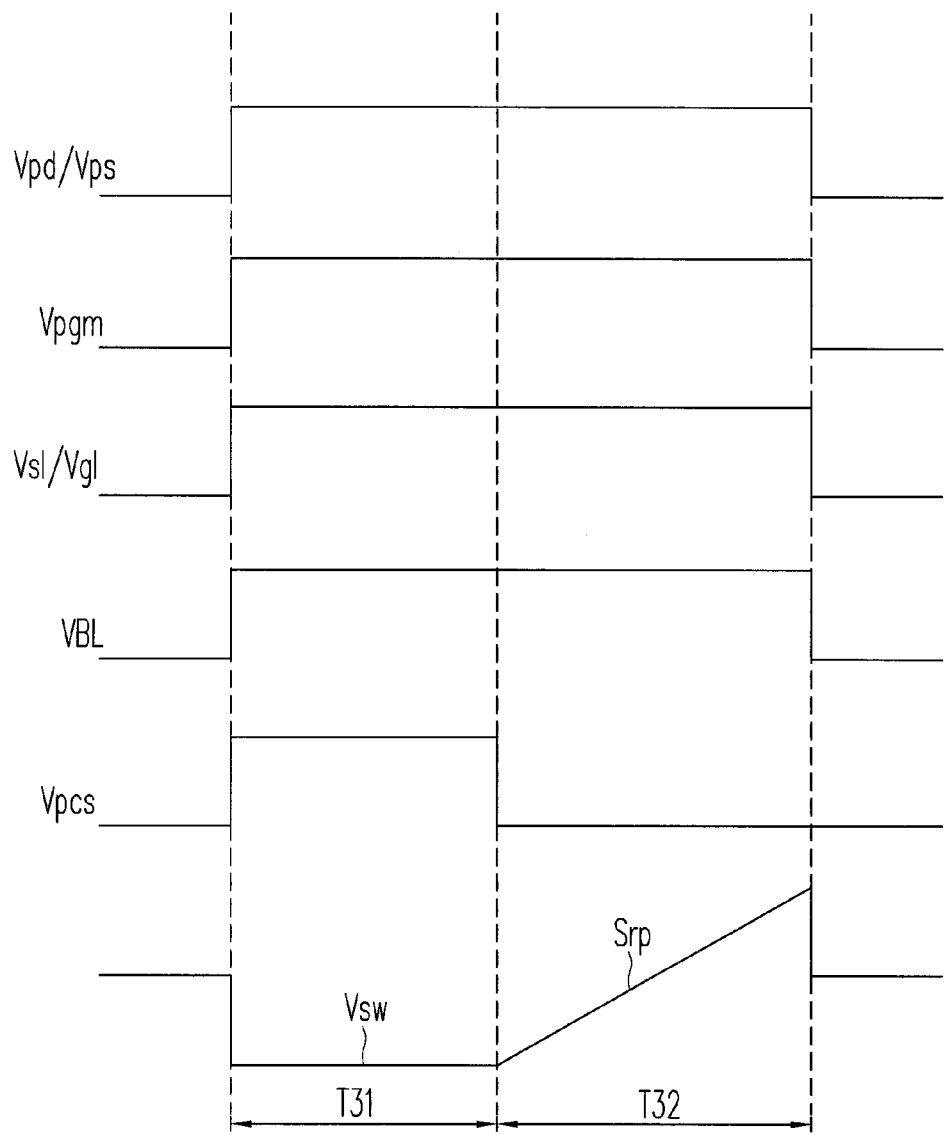
FIG. 3 is a waveform diagram of signals in a process of programming a memory array according to an embodiment of the invention.

FIG. 2 is a flowchart illustrating a method for programming a memory array according to an embodiment of the invention, and FIG. 3 is a waveform diagram of signals in a process of programming a memory array according to an embodiment of the invention. The method for programming the memory array is described below with reference of FIG. 1 to FIG. 3. In step S210 of FIG. 2, in a setup phase, a switching memory cell in the memory cells is turned off, and a first voltage and a second voltage are applied to a first source/drain and a second source/drain of the switching memory cell.

For example, as shown in FIG. 1, if data is to be programmed to the memory cell 107, the memory cell 107 is regarded as a selected memory cell, the memory cell 108 adjacent to the memory cell 107 is regarded as the switching memory cell, and the other memory cells 101-106 and 109-116 are regarded as non-selected memory cells. In order to program the selected memory cell 107, in the setup phase T31, a switching voltage Vsw is provided to the word line WL8 to turn off the switching memory cell 108.

Figure 4:
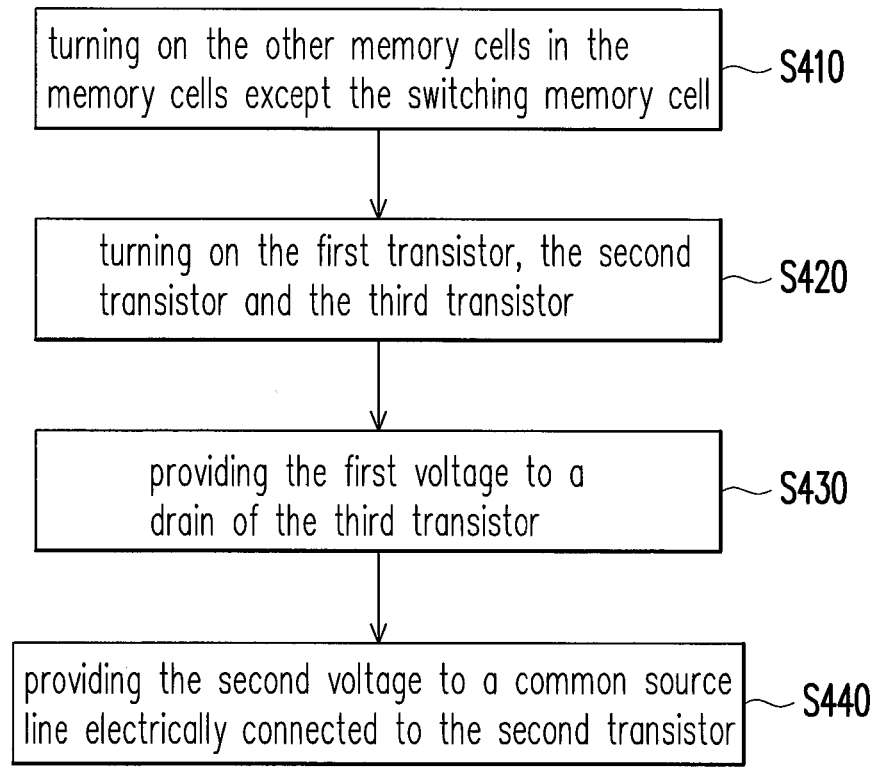
FIG. 4 is a flowchart illustrating details steps of a step S210.

Moreover, FIG. 4 is a flowchart illustrating details steps of the step S210. The step S210 of applying the first voltage and the second voltage to the first source/drain and the second source/drain of the switching memory cell is described below with reference of FIG. 1, FIG. 3 and FIG. 4.

As shown in S410, the other memory cells in the memory cells 101-116 except the switching memory cell 108, i.e. the selected memory cell 107 and the non-selected memory cells 101-106 and 109-116 are turned on. For example, in the setup phase T31, a passing voltage Vpd is provided to the word lines WL1-WL6, and a passing voltage Vps is provided to the word lines WL9-WL16 to turn on the non-selected memory cells 101-106 and 109-116. Moreover, a programming voltage Vpgm is provided to the word line WL7 to turn on the selected memory cell 107.

Moreover, in step S420, the first transistor SW1, the second transistor SW2 and the third transistor SW3 are turned on. For example, in the setup phase T31, selecting voltages Vs1 and Vg1 are respectively provided to gates of the first transistor SW1 and the second transistor SW2, and a pre-charge voltage Vpcs is provided to a gate of the third transistor SW3, so as to turn on the first transistor SW1, the second transistor SW2 and the third transistor SW3. Moreover, as the first transistor SW1 is turned on and the memory cells 101-107 are turned on, a channel 120 is formed. In addition, as the second transistor SW2 is turned on and the memory cells 109-116 are turned on, a channel 130 is formed.

Moreover, in step S430, the first voltage V1 is applied to the drain of the third transistor SW3. In this way, the bit line BL receives the first voltage V1, and the first voltage V1 is applied to the first source/drain of the switching memory cell 108 through the channel 120. Moreover, the first voltage V1 also charges the capacitor CP. On the other hand, in step S440, a second voltage V2 is applied to the common source line CSL.

In this way, the second voltage V2 is provided to the second source/drain of the switching memory cell 108 through the channel 130.

Referring to FIG. 1 to FIG. 3, after the first source/drain and the second source/drain of the switching memory cell 108 are respectively supplied with the first voltage V1 and the second voltage V2, in step S220, in a programming phase, a bit line connected to the memory cell string is floating, and a ramp signal is provided to a word line electrically connected to the switching memory cell.

For example, in the programming phase T32, the pre-charge voltage Vpcs is stopped from being provided to the gate of the third transistor SW3. In this way, the third transistor SW3 is turned off, and the bit line BL is floating. It should be noticed that although the bit line BL is in a floating state, since the first voltage V1 has been stored to the capacitor CP in the setup phase T31, during an initial stage of the programming phase T32, the capacitor CP can still continually supply the first voltage V1 to the bit line BL.

Moreover, in the programming phase T32, a ramp signal Srp with a gradually increased voltage level is provided to the word line WL8. In this way, as the voltage level of the ramp signal Srp gradually increases, the switching memory cell 108 is gradually switched from a fully-off state to a fully-on state. Moreover, during the initial stage of the programming phase T32, the capacitor CP can still continually supply the first voltage V1 to the bit line BL.

Therefore, when a voltage difference between the first voltage V1 and the second voltage V2 is greater than a predetermined voltage, for example, when the first voltage V1 and the second voltage V2 are respectively a bit line voltage VBL and a ground voltage GND, as a conducting state of the switching memory cell 108 is changed, the voltage of the first source/drain of the switching memory cell 108 is gradually pulled down from the first voltage V1 to the second voltage V2, and an electron current from the channel 130 to the channel 120 is generated. In this way, as the voltage of the first source/drain of the switching memory cell 108 is changed, at a certain moment, electrons in a channel of the selected memory cell 107 may have enough energy to inject into a floating gate of the selected memory cell 107, so that programming of the selected memory cell 107 is completed in the programming phase T32.

On the other hand, when the difference between the first voltage V1 and the second voltage V2 is not greater than the predetermined voltage, for example, when the first voltage V1 and the second voltage V2 are all the ground voltage GND, the selected memory cell 107 cannot be programmed in the programming phase T32. In other words, in case that the second voltage V2 is set to the ground voltage GND, if the first voltage V1 is the bit line voltage VBL as that shown in FIG. 3, the selected memory cell 107 can be programmed in the programming phase T32. Conversely, if the first voltage V1 is the ground voltage GND, the programming of the selected memory cell 107 is inhibited in the programming phase T32.

It should be noticed that in the programming phase T32, the bit line BL is in the floating state, and the capacitor CP supplies the first voltage V1 to the bit line BL. Therefore, in the programming phase T32, a level of the first voltage V1 received by the bit line BL is gradually decreased as the capacitor CP discharges, so that the current flowing through the memory cell string 110 is decreased. Moreover, since the capacitance of the capacitor CP is far greater than the channel capacitance CH contributed by the memory cell string 110, in the programming state T32, the equivalent capacitances of the selected memory cells on different word lines all approach to the capacitance of the capacitor CP. Therefore, the selected memory cells on different word lines all have a same programming speed.

Figure 5:
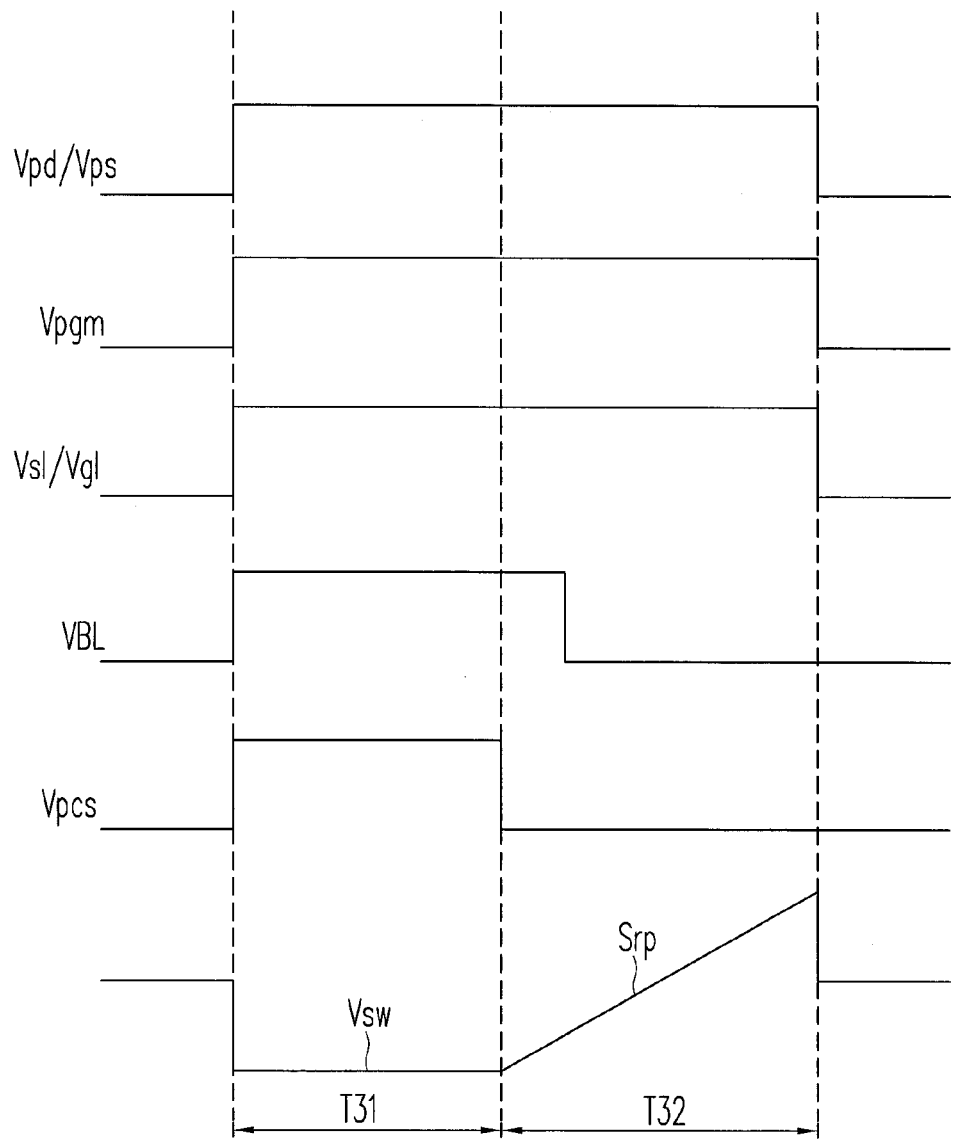
FIG. 5 and FIG. 6 are respectively waveform diagrams of signals in a process of programming a memory array according to another embodiment of the invention.
Figure 6:
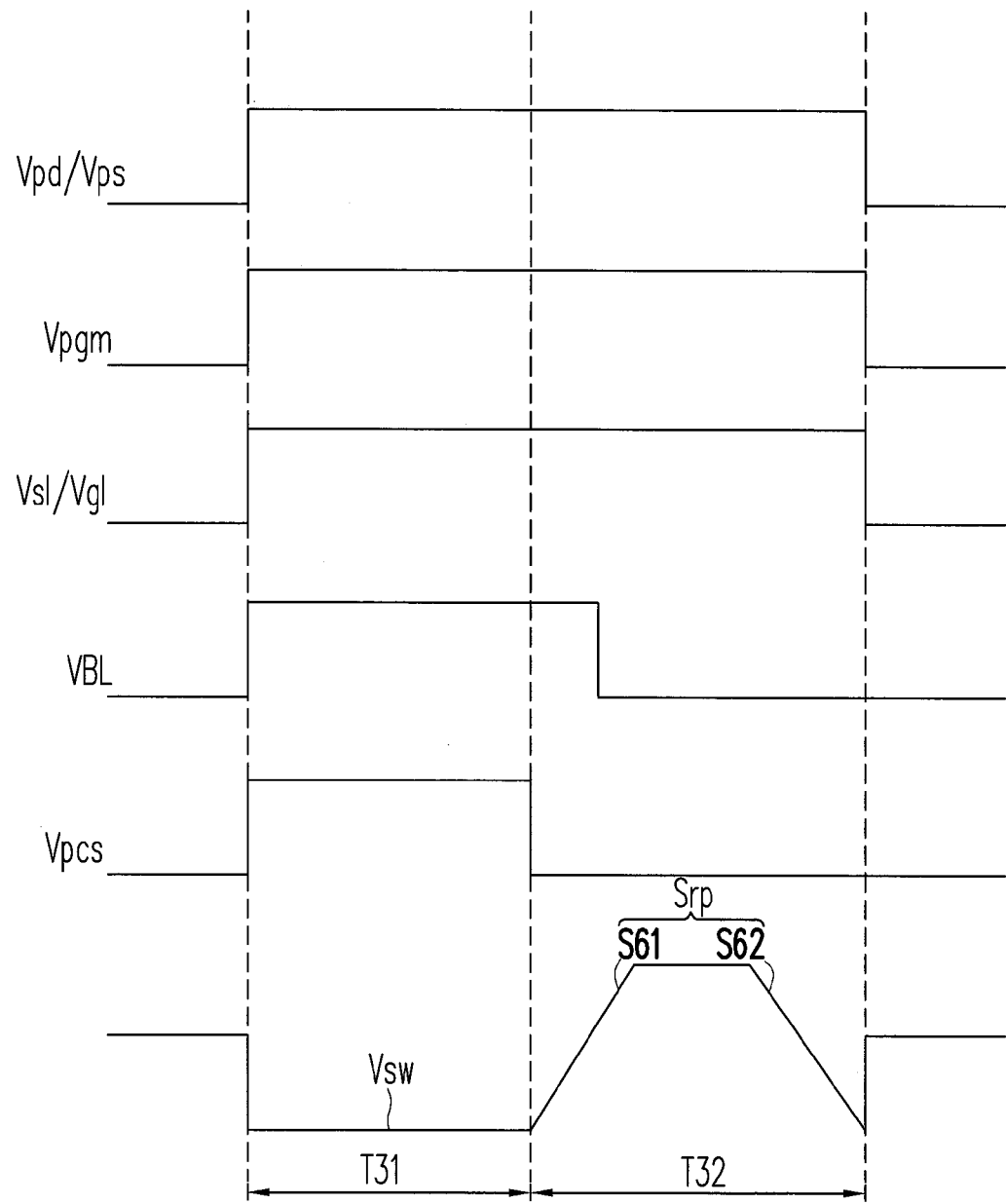

Moreover, although a waveform diagram for programming the memory array is illustrating in FIG. 3, the invention is not limited thereto. For example, FIG. 5 and FIG. 6 are respectively waveform diagrams of signals in a process of programming a memory array according to another embodiment of the invention. Referring to FIG. 3 and FIG. 5, a main difference there between is that in the embodiment of FIG. 3, the bit line voltage VBL (i.e. the first voltage V1) is continually supplied to the drain of the third transistor SW3 in both of the setup phase T31 and the programming phase T32, and in the embodiment of FIG. 5, the bit line voltage VBL (i.e. the first voltage V1) is supplied to the drain of the third transistor SW3 only in the setup phase T31 and the initial stage of the programming phase T32. However, since in both of the embodiments of FIG. 3 and FIG. 5, the pre-charge voltage Vpcs is stopped from being provided to the gate of the third transistor SW3 in the programming phase T32, regardless of whether the bit line voltage VBL (i.e. the first voltage V1) is continually supplied in the programming phase T32, the floating state of the bit line BL in the programming phase T32 is not influenced.

Moreover, Referring to FIG. 3 and FIG. 6, a main difference there between is that in the embodiment of FIG. 6, the bit line voltage VBL (i.e. the first voltage V1) is supplied in a same manner as that of the embodiment of FIG. 5. Moreover, in the embodiment of FIG. 6, the ramp signal Srp is composed of a first sub ramp signal S61 with a gradually increased voltage level and a second sub ramp signal S62 with a gradually decreased voltage level. Namely, in the embodiment of FIG. 6, during a first sub period of the programming phase T32, the first sub ramp signal S61 is provided to the word line WL8, and during a second sub period of the programming phase T32, the second sub ramp signal S62 is provided to the word line WL8. In this way, during the first sub period, the switching memory cell 108 is gradually switched from the fully-off state to the fully-on state. Moreover, during the second sub period, the switching memory cell 108 is gradually switched from the fully-on state to the fully-off state. In this way, in the programming phase T32, two programming operations can be performed on the selected memory cell 107.

Figure 7:
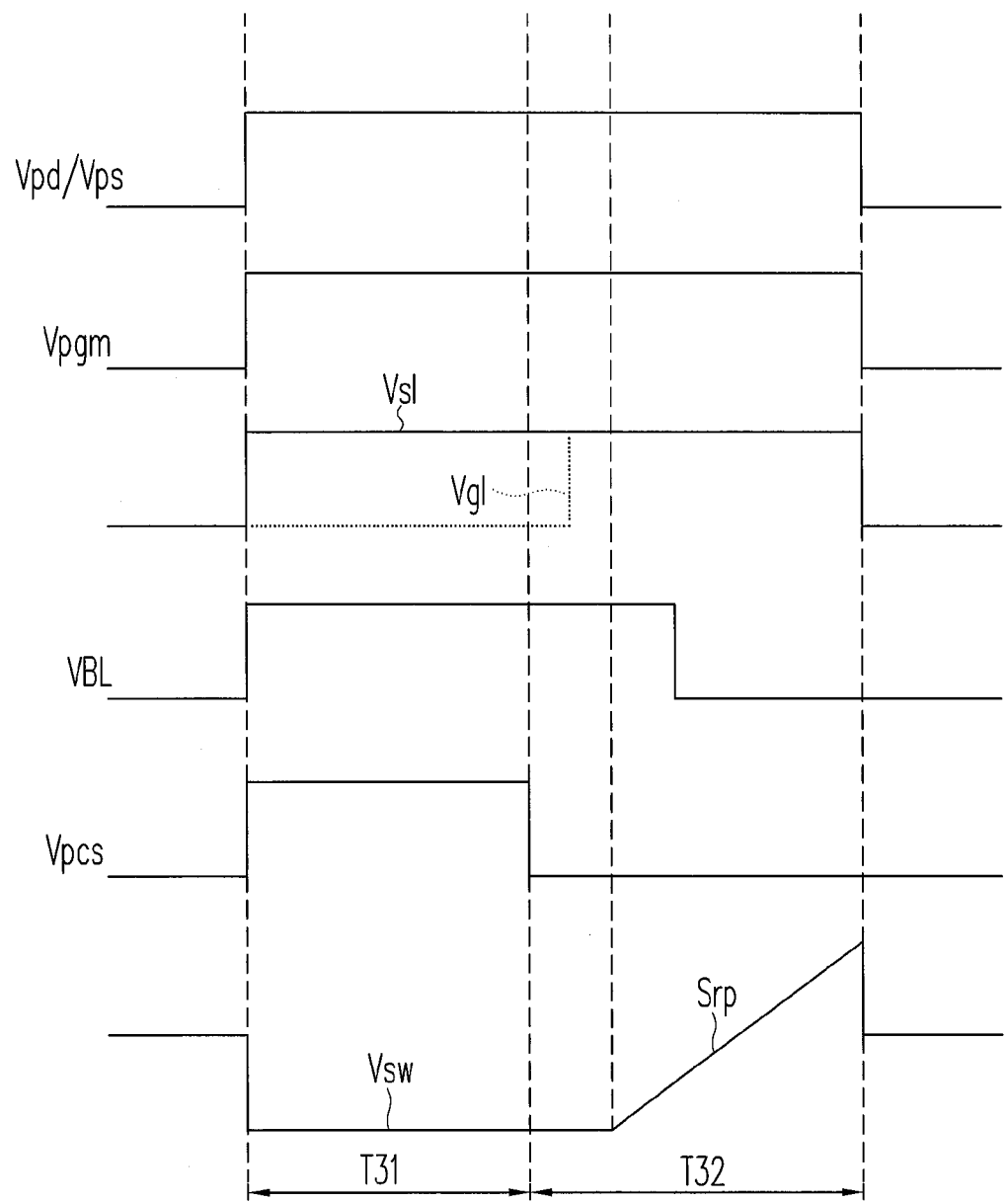
FIG. 7 is a waveform diagram of signals in a process of programming a memory array according to still another embodiment of the invention.

Further, FIG. 7 is a waveform diagram of signals in a process of programming a memory array according to still another embodiment of the invention. Referring to FIG. 3 and FIG. 7, a main difference there between is that in the embodiment of FIG. 7, the bit line voltage VBL (i.e. the first voltage V1) is supplied in a same manner as that of the embodiment of FIG. 5. Moreover, in the embodiment of FIG. 3, in the setup phase T31 and the programming phase T32, the selecting voltages Vs1 and Vg1 are simultaneously supplied, so that the first transistor SW1 and the second transistor SW2 are all in a turn-on state in the setup phase T31 and the programming phase T32.

However, in the embodiment of FIG. 7, the selecting voltage Vs1 is first provided in the setup phase T31, and then the selecting voltage Vg1 is provided in the programming phase T32. Therefore, in the setup phase T31, the second transistor SW2 is in a turn-off stage, so that the second voltage V2 cannot be supplied to the second source/drain of the switching memory cell 108. Comparatively, in the programming phase T32, the second transistor SW2 is turned on, and the second voltage V2 is supplied to the second source/drain of the switching memory cell 108. Moreover, in the embodiment of FIG. 7, after or as the second transistor SW2 is turned on, the ramp signal Srp is provided to the word line WL8. In this way, as described above, the switching memory cell 108 is gradually switched from the fully-off state to the fully-on state. Moreover, whether the selected memory cell 107 is programmed is determined according to the voltage difference between the first voltage V1 and the second voltage V2.

Figure 8:
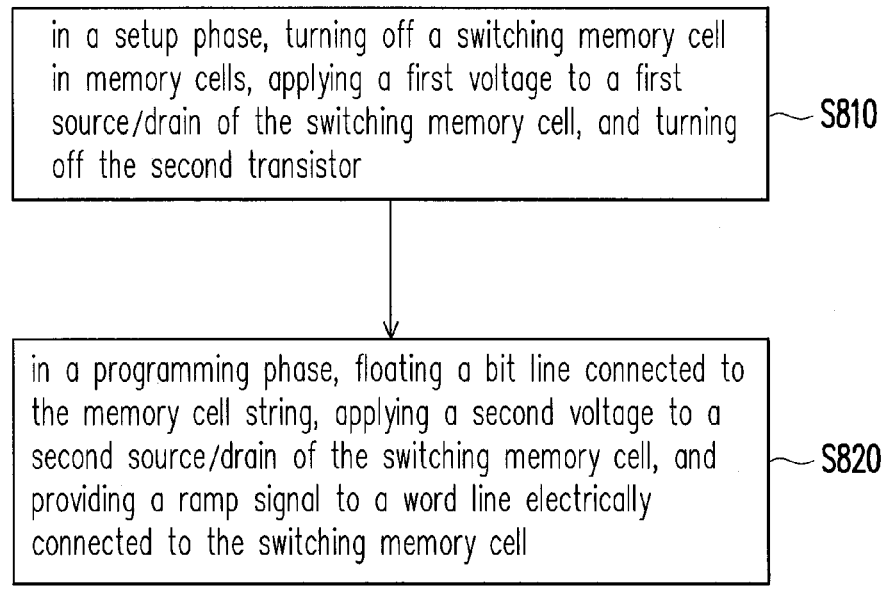
FIG. 8 is a flowchart illustrating a method for programming a memory array according to another embodiment of the invention.

According to the waveform diagram of FIG. 7, another flowchart of the method for programming the memory array is deduced as that shown in FIG. 8. In step S810, in the setup phase, the switching memory cell in the memory cells is turned off, and the first voltage is applied to the first source/drain of the switching memory cell, and the second transistor is turned off. Moreover, in step S820, in the programming phase, the bit line connected to the memory cell string is floating, the second voltage is applied to the second source/drain of the switching memory cell, and the ramp signal is provided to the word line electrically connected to the switching memory cell.

According to the flowcharts shown in FIG. 8 and FIG. 2, as described above, a main difference there between lies in different time points of applying the second voltage to the second source/drain of the switching memory cell. However, in both of the embodiments of FIG. 8 and FIG. 2, after the first source/drain and the second source/drain of the switching memory cell 108 are respectively supplied with the first voltage V1 and the second voltage V2, the selected memory cell 107 is programmed based on a variation of the conducting state of the switching memory cell 108. Therefore, details of the steps of the embodiment of FIG. 8 have been described in the aforementioned embodiments, which are not repeated herein.

In summary, the first voltage and the second voltage are first applied to the first source/drain and the second source/drain of the switching memory cell, and then the selected memory cell is programmed based on a floating state of the bit line and variation of the conducting state of the switching memory cell. In this way, since the bit line is in the floating state in the programming phase, the current flowing through the memory cell string is reduced which avails reducing the power consumption of the memory array. Moreover, based on the equivalent capacitance contributed by the bit line in the floating state, the selected memory cells on different word lines all have the same programming speed, which avails improving reliability and whole performance of the memory array.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for programming a memory array, wherein the memory array comprises a memory cell string composed of a first transistor, a plurality of memory cells and a second transistor connected in series, and the method for programming the memory array comprising:
   in a setup phase, turning off a switching memory cell in the memory cells, and applying a first voltage and a second voltage to a first source/drain and a second source/drain of the switching memory cell; and
   in a programming phase, floating a bit line connected to the memory cell string, and providing a ramp signal to a word line electrically connected to the switching memory cell.

2. The method for programming the memory array as claimed in claim 1, wherein the memory array further comprises a third transistor, wherein a source of the third transistor is electrically connected to the bit line, and the step of applying the first voltage and the second voltage to the first source/drain and the second source/drain of the switching memory cell comprises:
   turning on the other memory cells in the memory cells except the switching memory cell;
   turning on the first transistor, the second transistor and the third transistor;
   providing the first voltage to a drain of the third transistor; and
   providing the second voltage to a common source line electrically connected to the second transistor.

3. The method for programming the memory array as claimed in claim 2, further comprising:
   turning off the third transistor in the programming phase to float the bit line connected to the memory cell string.

4. The method for programming the memory array as claimed in claim 1, wherein the step of providing the ramp signal to the word line electrically connected to the switching memory cell comprises:
   providing a first sub ramp signal with a gradually increased voltage level to the word line during a first sub period of the programming phase; and
   providing a second sub ramp signal with a gradually decreased voltage level to the word line during a second sub period of the programming phase, wherein the ramp signal is composed of the first sub ramp signal and the second sub ramp signal.

5. The method for programming the memory array as claimed in claim 1, wherein when a difference between the first voltage and the second voltage is greater than a predetermined voltage, a selected memory cell adjacent to the switching memory cell in the memory cells is programmed in the programming phase, and when the difference between the first voltage and the second voltage is not greater than the predetermined voltage, the programming of the selected memory cell is inhibited in the programming phase.

6. A method for programming a memory array, wherein the memory array comprises a memory cell string composed of a first transistor, a plurality of memory cells and a second transistor connected in series, and the method for programming the memory array comprising:
   in a setup phase, turning off a switching memory cell in the memory cells, applying a first voltage to a first source/drain of the switching memory cell, and turning off the second transistor; and
   in a programming phase, floating a bit line connected to the memory cell string, applying a second voltage to a second source/drain of the switching memory cell, and providing a ramp signal to a word line electrically connected to the switching memory cell.

7. The method for programming the memory array as claimed in claim 6, wherein the memory array further comprises a third transistor, wherein a source of the third transistor is electrically connected to the bit line, and the step of applying the first voltage to the first source/drain of the switching memory cell comprises:
   turning on the other memory cells in the memory cells except the switching memory cell;
   turning on the first transistor and the third transistor; and
   providing the first voltage to a drain of the third transistor.

8. The method for programming the memory array as claimed in claim 7, further comprising:
   turning off the third transistor in the programming phase to float the bit line connected to the memory cell string.

9. The method for programming the memory array as claimed in claim 6, wherein the step of applying the second voltage to the second source/drain of the switching memory cell comprises:
turning on the second transistor and
providing the second voltage to a common source line electrically connected to the second transistor.

10. The method for programming the memory array as claimed in claim 6, wherein the step of providing the ramp signal to the word line electrically connected to the switching memory cell comprises:
providing a first sub ramp signal with a gradually increased voltage level to the word line during a first sub period of the programming phase; and
providing a second sub ramp signal with a gradually decreased voltage level to the word line during a second sub period of the programming phase, wherein the ramp signal is composed of the first sub ramp signal and the second sub ramp signal.

11. The method for programming the memory array as claimed in claim 6, wherein when a difference between the first voltage and the second voltage is greater than a predetermined voltage, a selected memory cell adjacent to the switching memory cell in the memory cells is programmed in the programming phase, and when the difference between the first voltage and the second voltage is not greater than the predetermined voltage, the selected memory cell is not programmed in the programming phase.

12. A memory array, comprising:
a memory cell string, electrically connected in series between a bit line and a common source line, and comprising a first transistor, a plurality of memory cells and a second transistor;
a third transistor, having a source electrically connected to the bit line and a drain receiving a first voltage; and
a capacitor, electrically connected to the bit line,
wherein in a setup phase, the memory array turns off a switching memory cell in the memory cells and turns on the first transistor, the second transistor and the third transistor so as to apply the first voltage and a second voltage to a first source/drain and a second source/drain of the switching memory cell,
in a programming phase, the memory array turns off the third transistor to float the bit line, and provides a ramp signal to a word line electrically connected to the switching memory cell.

13. The memory array as claimed in claim 12, wherein the capacitor is an equivalent capacitor of the bit line.

14. The memory array as claimed in claim 12, wherein the capacitor comprises an equivalent capacitor of the bit line and an additional capacitor electrically connected in series between the bit line and a ground.

15. The memory array as claimed in claim 12, wherein the memory array provides a first sub ramp signal with a gradually increased voltage level to the word line during a first sub period of the programming phase, and the memory array provides a second sub ramp signal with a gradually decreased voltage level to the word line during a second sub period of the programming phase, wherein the ramp signal is composed of the first sub ramp signal and the second sub ramp signal.

16. The memory array as claimed in claim 12, wherein when a difference between the first voltage and the second voltage is greater than a predetermined voltage, the memory array programs a selected memory cell adjacent to the switching memory cell in the memory cells in the programming phase, and when the difference between the first voltage and the second voltage is not greater than the predetermined voltage, the memory array inhibits the programming of the selected memory cell in the programming phase.

17. A memory array, comprising:
a memory cell string, electrically connected in series between a bit line and a common source line, and comprising a first transistor, a plurality of memory cells and a second transistor;
a third transistor, having a source electrically connected to the bit line and a drain receiving a first voltage; and
a capacitor, electrically connected to the bit line,
wherein in a setup phase, the memory array turns off a switching memory cell in the memory cells, turns on the first transistor and the third transistor so as to apply the first voltage to a first source/drain of the switching memory cell, and turns off the second transistor,
in a programming phase, the memory array turns off the third transistor to float the bit line, turns on the second transistor so as to apply the a second voltage to a second source/drain of the switching memory cell, and provides a ramp signal to a word line electrically connected to the switching memory cell.

18. The memory array as claimed in claim 17, wherein the capacitor is an equivalent capacitor of the bit line.

19. The memory array as claimed in claim 17, wherein the capacitor comprises an equivalent capacitor of the bit line and an additional capacitor electrically connected in series between the bit line and a ground.

20. The memory array as claimed in claim 17, wherein when a difference between the first voltage and the second voltage is greater than a predetermined voltage, the memory array programs a selected memory cell adjacent to the switching memory cell in the memory cells in the programming phase, and when the difference between the first voltage and the second voltage is not greater than the predetermined voltage, the memory array inhibits the programming of the selected memory cell in the programming phase.

* * * * *